United States Patent
Ohama et al.

(10) Patent No.: US 7,459,968 B2
(45) Date of Patent: Dec. 2, 2008

(54) AUDIO POWER AMPLIFIER IC AND AUDIO SYSTEM PROVIDED WITH THE SAME

(75) Inventors: Shigeji Ohama, Kyoto (JP); Satoshi Oishi, Kyoto (JP); Masatsugu Souma, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 116 days.

(21) Appl. No.: 11/661,792

(22) PCT Filed: Sep. 9, 2005

(86) PCT No.: PCT/JP2005/016579
§ 371 (c)(1),
(2), (4) Date: Mar. 1, 2007

(87) PCT Pub. No.: WO2006/033240
PCT Pub. Date: Mar. 30, 2006

(65) Prior Publication Data
US 2007/0252644 A1    Nov. 1, 2007

(30) Foreign Application Priority Data
Sep. 21, 2004    (JP)    ............................. 2004-272645

(51) Int. Cl.
*H03F 3/38* (2006.01)
(52) U.S. Cl. .................................. 330/10; 381/120
(58) Field of Classification Search .................. 330/10; 381/120
See application file for complete search history.

(56) References Cited

U.S. PATENT DOCUMENTS

| | | | | |
|---|---|---|---|---|
| 6,028,943 | A | 2/2000 | Nagata | 381/111 |
| 6,191,650 | B1* | 2/2001 | Backram et al. | 330/10 |
| 6,831,508 | B2* | 12/2004 | Shima | 330/10 |
| 2008/0080726 | A1* | 4/2008 | Chen et al. | 381/120 |

FOREIGN PATENT DOCUMENTS

| | | |
|---|---|---|
| JP | 63-234706 | 9/1988 |
| JP | 11-317629 | 11/1999 |
| JP | 2002-299968 | 10/2002 |
| JP | 2003-060443 | 2/2003 |
| JP | 2005-269580 | 9/2005 |

* cited by examiner

*Primary Examiner*—Steven J Mottola
(74) *Attorney, Agent, or Firm*—Fish & Richardson P.C.

(57) ABSTRACT

An audio power amplifier IC which is capable of suppressing degradation in sound quality resulting from the frequency of a reference clock, and an audio system provided with the audio power amplifier IC are provided. The audio power amplifier IC includes a clock generation circuit generating an internal clock, a clock terminal for outputting the internal clock or receiving an external clock, a clock selection circuit selecting the internal clock or the external clock as a reference clock, a first audio signal input terminal for receiving a first audio signal, and a first digital power amplifier circuit performing pulse modulation on the first audio signal based on the reference clock to output a pulse synchronized with the reference clock.

3 Claims, 2 Drawing Sheets

AUDIO POWER AMPLIFIER IC AND AUDIO SYSTEM PROVIDED WITH THE SAME

TECHNICAL FIELD

The present invention relates to an audio power amplifier integrated circuit (IC) provided with a digital power amplifier circuit which performs pulse modulation such as Pulse Width Modulation (PWM) and Pulse Density Modulation (PDM) on an input audio signal and outputs the resultant audio signal, and an audio system provided with the audio power amplifier IC.

BACKGROUND ART

In recent years, an audio system such as a two-way stereo system and a home theater system has become widespread. In addition to two speakers respectively providing right and left outputs of a stereo sound (also hereinafter referred to as right and left speakers), the audio system is equipped with a speaker outputting a sound in which only the low-frequency sound is emphasized, for example, in order to enhance sound effects. Such an audio system requires a plurality of power amplifier circuits for respective speakers in order to output audio signals to a plurality of speakers. A so-called digital power amplifier (Class D amplifier) circuit which performs pulse modulation such as PWM and PDM to output a pulse is widely used as the above-described power amplifier circuit due to its high efficiency (for example, Japanese Patent Laying-Open No. 2002-299968 (Patent Documents 1)).

FIG. 2 is a block diagram showing an example of a conventional audio system using a digital power amplifier circuit. Referring to this figure, the audio system includes audio power amplifier ICs 101, 101a and 101b, and speakers 141, 141a, 141b and 142.

This audio system is referred to as a so-called two-way stereo system. In other words, the audio system outputs a stereo sound through audio power amplifier IC 101 from left and right speakers 141 and 142 based on stereo audio signals Lin and Rin input from outside, and outputs a stereo sound in which only the low-frequency sound is emphasized through audio power amplifier ICs 101a and 101b for low-frequency sounds from left and right speakers 141a and 141b for low-frequency sounds.

Furthermore, low-frequency-sound speakers 141a and 141b have a so-called Balanced Transformerless (BTL) configuration in which two drive inputs are driven in opposite phases to each other in order to increase the output.

Audio power amplifier IC 101, and audio power amplifier ICs 101a and 101b for low-frequency sounds are the same IC. Audio power amplifier ICs 101, 101a and 101b are each provided with digital power amplifier circuits 151 and 152, and a clock generation circuit 110 generating a reference clock BCLK, and the like.

Digital power amplifier circuits 151 and 152 each perform pulse modulation based on reference clock BCLK on each audio signal input thereto, and outputs a resultant pulse synchronized with reference clock BCLK.

Audio power amplifier IC 101 drives stereo speakers 141 and 142. Audio power amplifier ICs 101a and 101b for low-frequency sounds drive speakers 141a and 141b having the BTL configuration, respectively.

Patent Document 1: Japanese Patent Laying-Open No. 2002-299968

DISCLOSURE OF THE INVENTION

Problems to be Solved by the Invention

In the audio power amplifier IC having the digital power amplifier circuit, switching by the pulse output synchronized with the reference clock results in generation of power supply noise and radiation noise which are higher harmonics.

The present inventors paid attention to the fact that, in the audio system using a plurality of audio power amplifier ICs as described above, the audio power amplifier ICs differ to some extent from each other in frequency of the reference clock due to factors such as property variations among ICs, and therefore, the difference between the frequencies of the power supply noise and the radiation noise generated from each audio power amplifier IC may cause a sound in an audible frequency band, that is, beat sound to be produced, to thereby degrade the sound quality in the audio system.

The present invention has been made in light of the above-described reasons. An object of the present invention is to provide an audio power amplifier IC which is capable of suppressing degradation in sound quality resulting from the frequency of a reference clock in an audio system using a plurality of audio power amplifier ICs, and the audio system provided with the audio power amplifier ICs.

Means for Solving the Problems

In order to solve the above-described problems, an audio power amplifier IC according to an aspect of the present invention includes a clock generation circuit generating an internal clock, a clock terminal for outputting the internal clock or receiving an external clock, a clock selection circuit selecting the internal clock or the external clock as a reference clock, a first audio signal input terminal for receiving a first audio signal, and a first digital power amplifier circuit performing pulse modulation on the first audio signal based on the reference clock to output a pulse synchronized with the reference clock.

Preferably, the audio power amplifier IC further includes a second audio signal input terminal for receiving a second audio signal, an inversion circuit inverting the first audio signal and outputting the resultant audio signal, an audio signal selection circuit selecting and outputting the audio signal output from the inversion circuit or the second audio signal, and a second digital power amplifier circuit performing pulse modulation on the selected audio signal based on the reference clock to output a pulse synchronized with the reference clock. The clock selection circuit selects the external clock as the reference clock in a case where the audio signal selection circuit selects the audio signal output from the inversion circuit.

In order to solve the above-described problem, an audio system according to an aspect of the present invention is an audio system provided with a first audio power amplifier IC and a second audio power amplifier IC, each of which includes a clock generation circuit generating an internal clock, a clock terminal for outputting the internal clock or receiving an external clock, a clock selection circuit selecting the internal clock or the external clock as a reference clock, a first audio signal input terminal for receiving a first audio signal, a first digital power amplifier circuit performing pulse modulation on the first audio signal based on the reference clock to output a pulse synchronized with the reference clock, a second audio signal input terminal for receiving a second audio signal, an inversion circuit inverting the first audio signal and outputting the resultant audio signal, an audio signal selection circuit selecting and outputting the audio signal output from the inversion circuit or the second audio signal, and a second digital power amplifier circuit performing pulse modulation on the selected audio signal based on the reference clock to output a pulse synchronized with the reference clock. The clock selection circuit selects the external clock as the reference clock in a case where the audio signal selection circuit selects the audio signal output from the inversion circuit. In the audio system, the clock terminals respectively of the first audio power amplifier IC and the second audio power amplifier IC are connected to each other. In the first audio power amplifier IC, the clock selection circuit selects the internal clock as the reference clock and outputs the internal clock from the clock terminal. In the second audio power amplifier IC, the clock selection circuit selects the external clock as the reference clock received from the first audio power amplifier IC via the clock terminal.

EFFECTS OF THE INVENTION

In the audio power amplifier IC according to the present invention, the clock selection circuit selects the internal clock or the external clock as a reference clock. Thus, in the audio system using a plurality of audio power amplifier ICs according to the present invention, the same frequency of the reference clock can be provided in every audio power amplifier IC, and therefore, no beat sound is produced to thereby allow degradation in sound quality to be suppressed. Furthermore, the audio system according to the present invention uses this audio power amplifier IC to thereby allow a high-quality system to be implemented.

DESCRIPTION OF THE REFERENCE SIGNS 1, 1a, 1b, 101, 101a, 101b audio power amplifier IC, 41, 41a, 41b, 42, 42a, 42b, 141, 141a, 141b, 142 speaker, 10, 110 clock generation circuit, 11 clock selection circuit, 12 audio signal selection circuit, 13 selection control circuit, 14 inversion circuit, 2a, 2b, 31, 31a, 31b, 32, 32a, 32b lowpass filter, 151, 152 digital power amplifier circuit, 51 digital power amplifier circuit (first digital power amplifier circuit), 52 digital power amplifier circuit (second digital power amplifier circuit), 61, 62 pulse modulation circuit, 71, 72 output circuit, CLK clock terminal, CNT control terminal, IN1 audio signal input terminal (first audio signal input terminal), IN2 audio signal input terminal (second audio signal input terminal), OUT1 pulse output terminal (first pulse output terminal), OUT2 pulse output terminal (second pulse output terminal), Lin audio signal (first audio signal), Rin audio signal (second audio signal), BCLK reference clock.

BEST MODES FOR CARRYING OUT THE INVENTION

The embodiments of the present invention will be hereinafter described with reference to the accompanying drawings.

Figure 1:
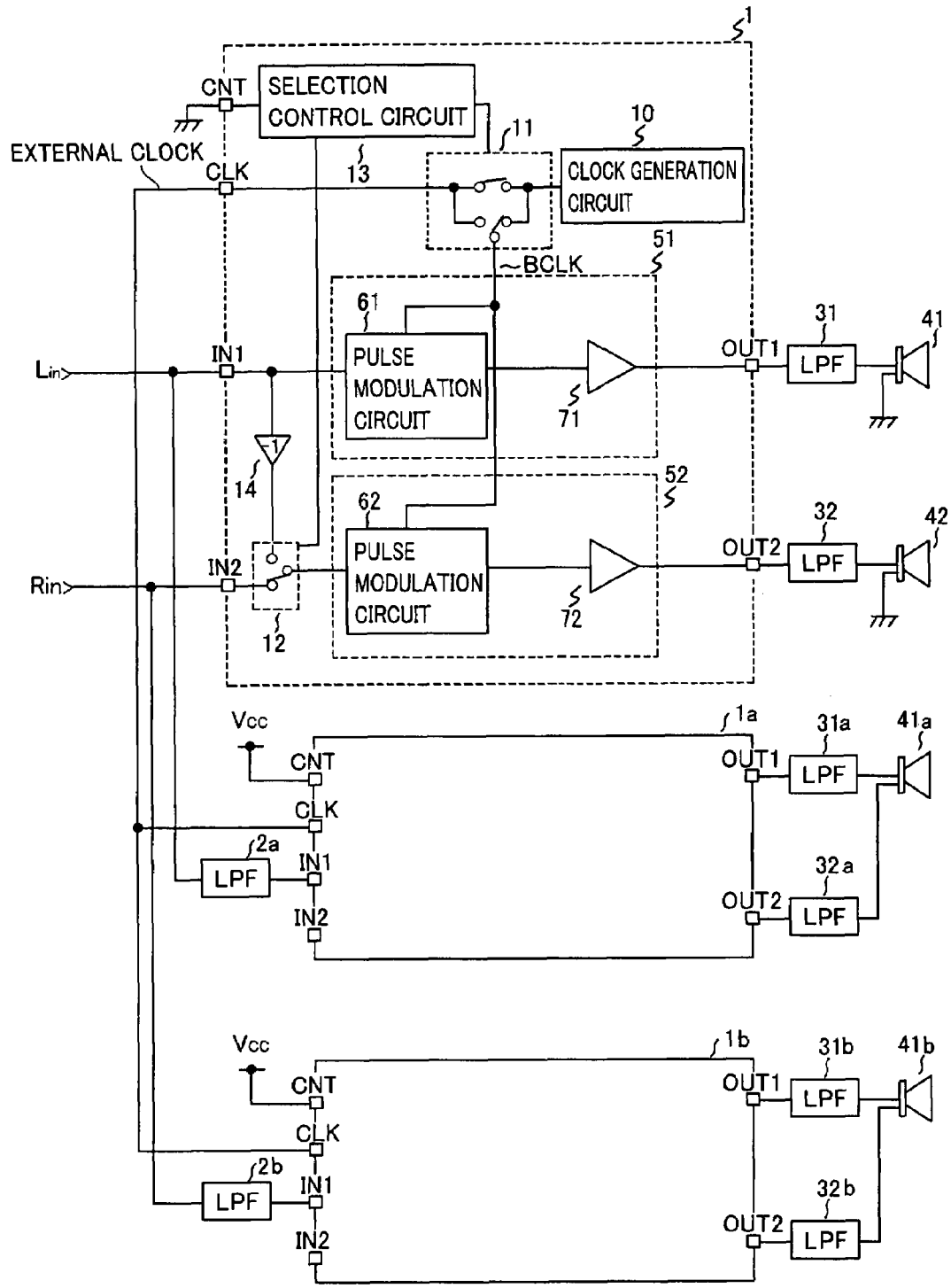
FIG. 1 is a block diagram showing a plurality of audio power amplifier ICs and a configuration of an audio system provided with the plurality of audio power amplifier ICs, according to an embodiment of the present invention.
Figure 2:
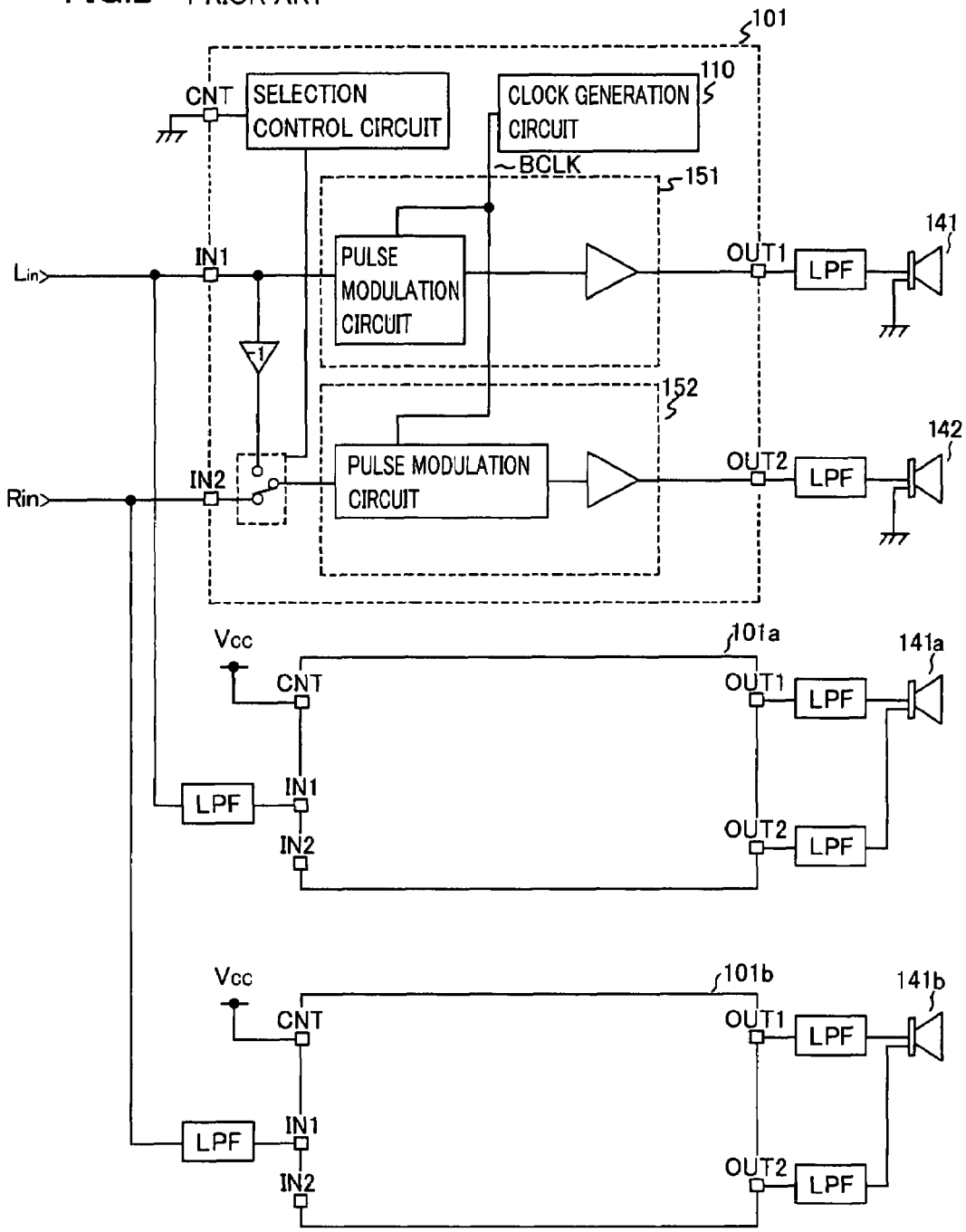
FIG. 2 is a block diagram showing an example of a conventional audio system using a digital power amplifier circuit.

FIG. 1 is a block diagram showing a plurality of audio power amplifier ICs and a configuration of the audio system provided with the plurality of audio power amplifier ICs, according to an embodiment of the present invention. An audio power amplifier IC 1 will first be described, followed by the configuration of the audio system.

Audio power amplifier IC 1 includes an audio signal input terminal (first audio signal input terminal) IN1 and an audio signal input terminal (second audio signal input terminal) IN2, a pulse output terminal (first pulse output terminal) OUT1 and a pulse output terminal (second pulse output terminal) OUT2, a clock terminal CLK, a control terminal CNT, digital power amplifier circuits (first digital power amplifier circuit) 51 and (second digital power amplifier circuit) 52, a clock generation circuit 10, a clock selection circuit 11, an audio signal selection circuit 12, a selection control circuit 13, and an inversion circuit 14.

Digital power amplifier circuit 51 includes a pulse modulation circuit 61 and an output circuit 71. Digital power amplifier circuit 52 includes a pulse modulation circuit 62 and an output circuit 72.

An audio signal (first audio signal) Lin and an audio signal (second audio signal) Rin are output to audio signal input terminal IN1 and audio signal input terminal IN2, respectively.

Pulse-modulated pulses described below are output from pulse output terminals OUT1 and OUT2, respectively.

At clock terminal CLK, an internal clock described below is output or an external clock described below is received.

A voltage for controlling the selection of clock selection circuit 11 and audio signal selection circuit 12 described below is applied to control terminal CNT.

Digital power amplifier circuit 51 and inversion circuit 14 are connected to audio signal input terminal IN1.

Pulse modulation circuit 61 performs pulse modulation on audio signal Lin based on a reference clock BCLK to output a pulse synchronized with reference clock BCLK.

Output circuit 71 outputs the pulse received from pulse modulation circuit 61 with a low output impedance. The output of output circuit 71 is also an output of digital power amplifier circuit 51, and is then connected to pulse output terminal OUT1.

The configuration of digital power amplifier circuit 52 is substantially the same as digital power amplifier circuit 51. That is, pulse modulation circuit 62 performs pulse modulation on an audio signal output from audio signal selection circuit 12 based on reference clock BCLK, to output a pulse synchronized with reference clock BCLK. Output circuit 72 outputs the pulse received from pulse modulation circuit 62 with a low output impedance. The output of output circuit 72 is also an output of digital power amplifier circuit 52, and is then connected to pulse output terminal OUT2.

Pulse modulation circuit 61 outputs different pulses depending on the type of modulation method, such as PWM and PDM. In the case of PWM, the output pulse has a period equal to that of reference clock BCLK. The pulse width of the output pulse varies depending on the voltage of audio signal Lin. In other words, an increase in the voltage of audio signal Lin results in a broader pulse width, and a decrease in the voltage results in a narrower pulse width. In the case of PDM, the output pulse has a period equal to that of reference clock BCLK, and has a constant pulse width. The output pulse density varies depending on the voltage of audio signal Lin. That is, an increase in the voltage of audio signal Lin results in a higher pulse density, and a decrease in the voltage results in a lower pulse density.

Inversion circuit 14 inverts audio signal Lin and outputs the resultant audio signal. The output of inversion circuit 14 and audio signal input terminal IN2 are connected to the inputs of audio signal selection circuit 12. Audio signal selection circuit 12 selects and outputs the audio signal output from inversion circuit 14 or audio signal Rin based on control by selection control circuit 13 described below. Digital power amplifier circuit 52 is connected to the output of audio signal selection circuit 12.

Clock selection circuit 11 is connected to clock terminal CLK. Clock selection circuit 11 selects the internal clock or the external clock as reference clock BCLK based on control by selection control circuit 13 described below. The internal clock is generated by clock generation circuit 10. The external clock is generated by an external IC and the like, and received via clock terminal CLK.

If clock selection circuit 11 selects the internal clock as reference clock BCLK, it outputs the internal clock from clock terminal CLK. Furthermore, if clock selection circuit 11 selects the external clock as reference clock BCLK, it receives the external clock from clock terminal CLK, and electrically disconnects clock generation circuit 10 and clock terminal CLK from each other.

Selection control circuit 13 is connected to control terminal CNT. Selection control circuit 13 controls clock selection circuit 11 and audio signal selection circuit 12 based on the voltage level of control terminal CNT. That is, in the case where control terminal CNT is at a ground level, selection control circuit 13 causes clock selection circuit 11 to select the internal clock as reference clock BCLK, and audio signal selection circuit 12 to select audio signal Rin. On the other hand, in the case where control terminal CNT is at a power supply voltage VCC level, selection control circuit 13 causes clock selection circuit 11 to select the external clock as reference clock BCLK, and audio signal selection circuit 12 to select the audio signal output from inversion circuit 14.

If the external clock is selected as reference clock BCLK, the internal clock generated by clock generation circuit 10 is not used, and therefore, the operation of clock generation circuit 10 can be stopped.

The configuration of the audio system shown in FIG. 1 will then be described. The audio system, which is a two-way stereo system, receives stereo audio signals Lin and Rin, outputs the stereo sound from left and right speakers 41 and 42, and outputs the stereo sound in which only the low-frequency sound is emphasized from left and right speakers 41a and 41b for low-frequency sounds. Speakers 41a and 41b for low-frequency sounds have a so-called BTL configuration in which two drive inputs are driven in opposite phases to each other in order to increase the output.

This audio system includes audio power amplifier ICs (first audio power amplifier IC) 1, (second audio power amplifier IC) 1a and (second audio power amplifier IC) 1b, lowpass filters 2a, 2b, 31, 32, 31a, 32a, 31b and 32b, and speakers 41, 41a, 41b, 42, 42a and 42b.

Lowpass filters 31, 32, 31a, 32a, 31b and 32b eliminate a higher harmonic component resulting from reference clock BCLK from the pulse-modulated pulse, to obtain therefrom the signal in the audio frequency band. Each of lowpass filters 2a and 2b passes only the frequency corresponding to low-pitch sound of stereo audio signals Lin and Rin, respectively.

Lowpass filters 31 and 32 are connected to pulse output terminals OUT1 and OUT2 of audio power amplifier IC 1, respectively. Each of speakers 41 and 42 has one drive input connected to each output of lowpass filters 31 and 32, respectively, and has the other drive input grounded.

Audio power amplifier IC 1a is intended for low-frequency sounds on the left side. Audio signal Lin is output to lowpass filter 2a. The output of lowpass filter 2a is connected to audio signal input terminal IN1. Lowpass filters 31a and 32a are connected to pulse output terminals OUT1 and OUT2 of audio power amplifier IC 1a, respectively. Speaker 41a has two drive inputs connected to respective outputs of lowpass filters 31a and 32a, respectively.

Audio power amplifier IC 1b is intended for low-frequency sounds on the right side. Audio signal Rin is output to lowpass filter 2b. The output of lowpass filter 2b is connected to audio signal input terminal IN1. Lowpass filters 31b and 32b are connected to pulse output terminals OUT1 and OUT2 of audio power amplifier IC 1b, respectively. Speaker 41b has two drive inputs connected to respective outputs of lowpass filters 31b and 32b, respectively.

Clock terminals CLK of audio power amplifier ICs 1, 1a and 1b are connected to each other.

Audio power amplifier IC 1, and audio power amplifier ICs 1a and 1b for low-frequency sounds are the same ICs. Audio power amplifier ICs 1a and 1b each include digital power amplifier circuits 51 and 52, clock generation circuit 10, clock selection circuit 11, audio signal selection circuit 12, selection control circuit 13, and inversion circuit 14.

Audio power amplifier IC 1 has control terminal CNT connected to ground potential, and therefore, drives stereo speakers 41 and 42. Specifically, clock selection circuit 11 selects the internal clock as reference clock BCLK based on control by selection control circuit 13, and outputs the internal clock from clock terminal CLK. In other words, the internal clock output from audio power amplifier IC 1 is also an external clock for audio power amplifier ICs 1a and 1b.

Audio signal selection circuit 12 selects audio signal Rin based on control by selection control circuit 13, and outputs it to digital power amplifier circuit 52.

On the other hand, audio power amplifier ICs 1a and 1b for low-frequency sounds, each of which has control terminal CNT connected to power supply voltage VCC, drive speakers 41a and 41b of the BTL configuration, respectively. Specifically, clock selection circuit 11 selects the external clock as reference clock BCLK received from audio power amplifier IC 1 via clock terminal CLK, based on control by selection control circuit 13.

Audio signal selection circuit 12 selects the audio signal output from inversion circuit 14 based on control by selection control circuit 13, and outputs it to digital power amplifier circuit 52.

Therefore, in the audio system according to the embodiment of the present invention, the same frequency of reference clock BCLK can be provided in the three audio power amplifier ICs, and therefore, no beat sound is produced to thereby allow degradation in sound quality to be suppressed.

Furthermore, in the audio power amplifier IC according to the embodiment of the present invention, in the case where the speakers of the BTL configuration are driven, clock selection circuit 11 selects the external clock as reference clock BCLK based on control by selection control circuit 13. Therefore, the selection of reference clock BCLK in each of audio power amplifier ICs 1, 1a and 1b can be controlled only by control terminal CNT, to thereby allow the number of terminals to be reduced. However, control terminal CNT can also be separately provided.

Although the two-way stereo system using three audio power amplifier ICs 1, 1a and 1b has been described above, also in other audio systems such as a home theater system and the like, the same frequency of reference clock BCLK for every audio power amplifier IC causes no beat sound to be produced, to thereby allow degradation in sound quality to be suppressed. Consequently, a high-quality audio system can be provided.

Note that the audio power amplifier IC according to the embodiment of the present invention includes two audio signal input terminals and two digital power amplifier circuits, and therefore, allows a two-way stereo system to be implemented with three audio power amplifier ICs. However, the audio power amplifier IC is not limited to such a configuration, and can also be configured to include only one audio signal input terminal and only one digital power amplifier circuit. Although increase in cost is conceivable in this case, it also becomes possible to be more flexibly adapted to various audio systems (for example, a system provided with an odd number of speakers having no BTL configuration).

The design of the audio power amplifier IC and the audio system provided with the same according to the embodiment of the present invention can be variously changed. For example, the audio power amplifier IC and the audio system can also be configured in such a way that lowpass filter 2a or 2b is incorporated in the audio power amplifier IC and selection control circuit 13 determines whether lowpass filter 2a is used or not and whether lowpass filter 2b is used or not.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

What is claimed is:

1. An audio power amplifier IC comprising:
    a clock generation circuit generating an internal clock;
    a clock terminal for outputting said internal clock or receiving an external clock;
    a clock selection circuit selecting said internal clock or said external clock as a reference clock;
    a first audio signal input terminal for receiving a first audio signal; and
    a first digital power amplifier circuit performing pulse modulation on said first audio signal based on said reference clock to output a pulse synchronized with said reference clock.

2. The audio power amplifier IC according to claim 1, further comprising:
    a second audio signal input terminal for receiving a second audio signal;
    an inversion circuit inverting said first audio signal and outputting the resultant audio signal;
    an audio signal selection circuit selecting and outputting the audio signal output from said inversion circuit or said second audio signal; and
    a second digital power amplifier circuit performing pulse modulation on said selected audio signal based on said reference clock to output a pulse synchronized with said reference clock, wherein
    said clock selection circuit selects said external clock as said reference clock in a case where said audio signal selection circuit selects the audio signal output from said inversion circuit.

3. An audio system comprising a first audio power amplifier IC and a second audio power amplifier IC,
    said first audio power amplifier IC and said second audio power amplifier IC each including
    a clock generation circuit generating an internal clock,
    a clock terminal for outputting said internal clock or receiving an external clock,
    a clock selection circuit selecting said internal clock or said external clock as a reference clock,
    a first audio signal input terminal for receiving a first audio signal,
    a first digital power amplifier circuit performing pulse modulation on said first audio signal based on said reference clock to output a pulse synchronized with said reference clock,
    a second audio signal input terminal for receiving a second audio signal,
    an inversion circuit inverting said first audio signal and outputting the resultant audio signal,
    an audio signal selection circuit selecting and outputting the audio signal output from said inversion circuit or said second audio signal, and
    a second digital power amplifier circuit performing pulse modulation on said selected audio signal based on said reference clock to output a pulse synchronized with said reference clock, wherein
    said clock selection circuit selects said external clock as said reference clock in a case where said audio signal selection circuit selects the audio signal output from said inversion circuit,
    in said audio system,
    said clock terminals respectively of said first audio power amplifier IC and said second audio power amplifier IC are connected to each other,
    in said first audio power amplifier IC, said clock selection circuit selects said internal clock as said reference clock and outputs said internal clock from said clock terminal, and
    in said second audio power amplifier IC, said clock selection circuit selects the external clock as said reference clock received from said first audio power amplifier IC via said clock terminal.

* * * * *